United States Patent
Wagenaar et al.

(10) Patent No.: US 6,765,300 B1
(45) Date of Patent: Jul. 20, 2004

(54) MICRO-RELAY

(75) Inventors: Dirk Wagenaar, Singapore (SG); Kay Krupka, Berlin (DE); Helmut Schlaak, Ober-Ramstadt (DE); Uppili Sridhar, Singapore (SG); Victor D. Samper, Singapore (SG); Pang Dow Foo, Singapore (SG)

(73) Assignees: Tyco Electronics Logistics, AG, Steinach (CH); Institute of Microelectronics, Singapore (SG)

( * ) Notice: Subject to any disclaimer, the term of this patent is extended or adjusted under 35 U.S.C. 154(b) by 0 days.

(21) Appl. No.: 09/890,575

(22) PCT Filed: Feb. 4, 1999

(86) PCT No.: PCT/SG99/00005

§ 371 (c)(1),
(2), (4) Date: Feb. 11, 2002

(87) PCT Pub. No.: WO00/46852

PCT Pub. Date: Aug. 10, 2000

(51) Int. Cl.[7] .......................... H01L 23/48; H01L 23/52; H01L 29/40
(52) U.S. Cl. ....................... 257/780; 257/781; 257/785; 257/786; 310/309; 310/328; 200/181; 200/522
(58) Field of Search ................................. 257/735, 736, 257/780, 781, 785, 786; 310/309, 328; 200/181, 522

(56) References Cited

U.S. PATENT DOCUMENTS

| 5,479,042 A | * 12/1995 | James et al. ................. 257/415 |
| 5,544,001 A | * 8/1996 | Ichiya et al. ................. 361/233 |
| 5,629,565 A | 5/1997 | Schlaak et al. |
| 6,483,056 B2 | * 11/2002 | Hyman et al. .............. 200/181 |

FOREIGN PATENT DOCUMENTS

DE  4205340 C1  8/1993

OTHER PUBLICATIONS

See PCT International Search Report for any references that are not enclosed herewith.

* cited by examiner

*Primary Examiner*—Ori Nadav

(57) ABSTRACT

A microstructure relay is provided, having a body that includes upper and lower portions. The lower portion is formed from a substrate, and the upper portion is formed on the substrate to avoid bonding of the lower portion to the upper portion. A support member is fixed to the body at a first end of the support member to form a cantilever, wherein an upper surface of the support member and a lower surface of the upper portion of the body form a cavity. A first contact region is located on the upper surface at a second end of the support member. The first contact region comprises a first contact, wherein pivoting the support member toward the lower surface causes the first contact to be electrically coupled to a counter contact.

45 Claims, 14 Drawing Sheets

MICRO-RELAY

FIELD OF THE INVENTION

The invention relates generally to microstructures and particularly to relays and switches or valves formed from microstructures.

BACKGROUND OF THE INVENTION

Electrical relays are widely used in various applications. Such applications include, for example, the selection of different electrical paths or the opening or closing of an electrical circuit.

Typically, relays include a coil and mechanical components for engaging and disengaging a pair of contacts. Upon energizing the coil, an electromagnetic field is generated to engage the contacts, forming the electrical connection.

There is now a demand for the miniaturization of consumer goods (e.g., electronic and telecommunication products) or electronic equipments (e.g., automated test equipment), which creates a corresponding need to reduce the size of relays. However, conventional electromechanical relays do not lend easily to miniaturization. For example, there is a limit as to the size of coils that can be reduced. Such limitations reduce the extent of miniaturization of products using relays.

The above discussion evidences a need to provide a relay design that allows for further miniaturization.

SUMMARY OF THE INVENTION

The invention relates to a microstructure relay. The relay comprises a body having upper and lower portions. A support member having a first end fixed to the body to form a cantilever is provided. The upper surface of the support member and a lower surface of the upper portion of the body form a cavity. A first contact region is located on the upper surface at a second end of the support member. The first contact region includes a first contact that is electrically coupled to a second contact when the support member is moved upward toward the lower surface.

In accordance with one embodiment of the invention, the upper portion of the body is formed on the lower portion of the body. This requires only a single substrate to fabricate the relay, avoiding the need to bond upper and lower portions of the relay together.

In accordance with another embodiment of the invention, the relay comprises an s-shaped support member to provide over-travel. First and second stress layers are used to form the s-shape support member. The first stress layer induces compressive stress to cause the support member to bend away form the upper portion of the relay, and a second layer is provided to induce the first contact region to bend in the opposite direction toward the upper portion of the relay. The first stress layer can be patterned to be on the support member except in the first contact region. The stress layers, in one embodiment, comprise high temperature materials formed using semiconductor processing techniques.

A method for fabricating microstructures is provided. The method includes the use of electrochemical etching to form microstructures. Electrochemical etching relies on an etch stop which, for example, may be a p-n junction. The electrochemical etch etches, for example, p-doped portion or region and stops on n-doped region. In one embodiment, a heavily doped p-type region is used. The use of a heavily doped p-type region enables the etch to form holes or slots having lateral dimensions less than 250 $\mu$m.

DESCRIPTION OF THE INVENTION

The invention relates to the fabrication of microstructures. In particular, the invention relates to forming relays from microstructures. The use of microstructures enables the fabrication of miniature relays.

Figure 1A:
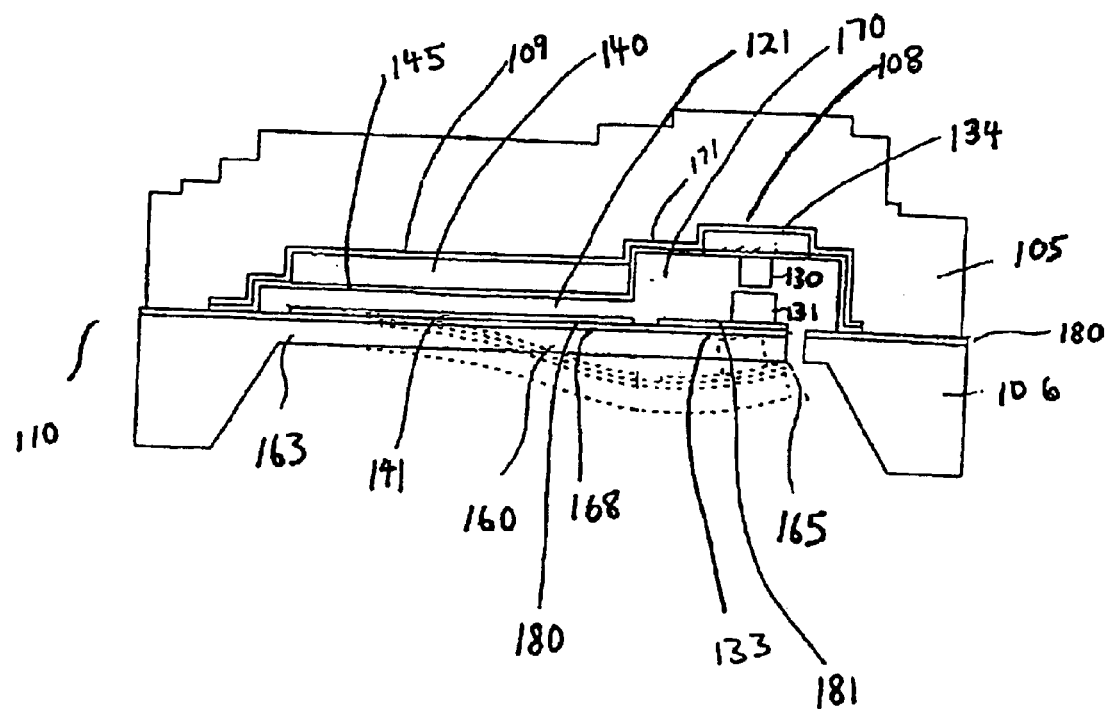
FIGS. 1a–1b are cross-sectional and plan views of a relay in accordance with one embodiment of the invention.
Figure 1B:
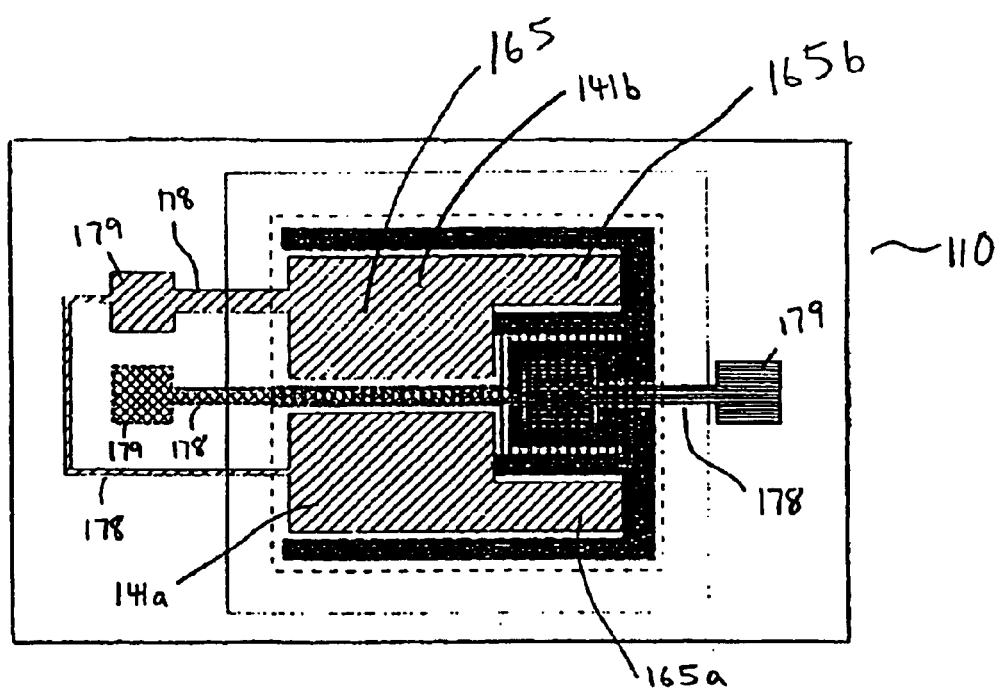

FIGS. 1a–b are cross-sectional and plan views, respectively, of a micro-relay in accordance with one embodiment of the invention. As shown, the relay comprises a body 110. The body includes a support member 160. The support member is supported at a first end 163 by the body, forming a cantilever. A first contact region 133 is provided at about a second end 165 of the support member. The first contact region comprises a first contact 131.

A gap separates a top surface 168 of the support member and a surface 109 of the body, forming a cavity 121. The cavity allows the support member to pivot about the first end 163. The surface 109 comprises a contact region 134 on which a second contact 130 is provided. The second contact is usually referred to as the counter contact. The first and second contacts are positioned such that they contact each other when the support member is pivoted upward toward surface 109. The dimensions of the contacts depend on design parameters and can be varied as required. Typically, the height of the contacts is about 2–10 microns ($\mu$m).

An electrostatic force is used to move or pivot the support member toward surface 109 to engage the first and second contacts. The relay incorporates the use of electrodes having opposite charges or opposite dipole layers applied thereto to generate the electrostatic force.

In accordance with one embodiment of the invention, a first electrode 141 is located on the surface 168 of the support member and a second electrode 140 is located on the surface 109 of the body. The electrodes are isolated from the contacts. The first and second electrodes, as shown, are aligned with each other to produce an electrostatic force when opposite charges are applied to the electrodes. A dielectric layer 145 is provided either on the first or the second electrode to prevent shorting when the support member is moved upward toward surface 109. Providing a dielectric layer on both electrodes is also useful.

In effect, the electrodes and dielectric layer form a capacitor for generating the electrostatic force. The amount of electrostatic force generated depends on, for example, the surface area of the electrodes, the voltage applied to the electrodes (pull-in voltage), and the distance between the electrodes. The applied voltage needed to create a sufficient electrostatic force depends on design parameters such as the stiffness of the support member and the contact force desired.

In one embodiment, the body includes upper and lower portions 105 and 106. The lower portion 106 preferably comprises silicon. Other crystalline materials such as gallium arsenide are also useful. Materials such as quartz, ceramics, glass, silicate glass such as borosilicate glass, Pyrex®, or other materials that can provide support for the relay components can also be used. The upper portion 105, in one embodiment, comprises nickel or a nickel alloy such as nickel-iron. Other materials, including gold, alloys, plastic, epoxy, and materials that can adequately support the relay components as needed, can also be used.

In accordance with one embodiment of the invention, the upper portion is formed or deposited on the lower portion. This advantageously avoids the need to bond the upper and lower portions together as required by conventional two wafer approaches, improving reliability and lowering manufacturing cost.

In the upper portion, surface 109 is provided on which the second contact 130 is located. The second contact is formed in a second contact region 134 on surface 109. As shown, a surface 108 in the second contact region is recessed from surface 109 to produce a separate contact region for the contact. A second contact region that is not recessed from surface 109 can also be used. The contact comprises a conductive material. The contact material should have low contact resistance, good thermal conductance, and hardness to resist sticking over the life time of the relay. Other desirable characteristics of the contact material includes high resistance against light arcing, high light arcing voltage, low stress, and low or no cold welding effects. In one embodiment, the contact comprises gold. For example, including gold such as gold-palladium, gold-nickel, and gold-cobalt or alloys including silver are also useful. Other conductive materials that provide good contact characteristics are also useful to form the contact.

Supported by the body at the first end 163 is the support member 160. The first contact region 133 comprising the first contact 131 is located at about the second end 165 of the support member. It is not necessary to use the same material to form both the first and second contacts. When the support member is moved upward, the contacts make contact with each other.

In one embodiment, the support member is part of the lower portion of the body. Such a support member comprises the same material as the lower portion of the body. In a preferred embodiment, the support member comprises single crystalline silicon. Other single crystalline materials are also useful for forming the lower portion and support. Materials that comprise good spring characteristics such as low fatigue and creep are also useful.

Providing a support member that is not part of the lower portion of the body is also useful. With such a design, materials which are different from those comprising the lower portion of the body can be used for the support member. Materials that exhibit good spring characteristics are useful to form the support member. In one embodiment, the support member comprises polysilicon (poly). The poly can be deposited either as poly or as amorphous silicon and recrystallized to form poly. The use of epitaxially grown single crystalline material to form the support member is also useful. Nickel, nickel alloy such as nickel-iron, metals, or metal alloys that show good spring characteristics can also be used to form the support member.

The second electrode 140 is provided on the surface 109 of the upper portion of the body, and the first electrode 141 is provided on the surface 168 of the support member. The electrodes comprise a conductive material. Various conductive or semi-conductive materials can be used to form the electrodes. To simplify processing, the electrodes can be formed from the same material used to form the contacts. The thickness of the electrodes is not critical. However, the first electrode should be relatively thin to reduce the impact of mechanical stress induced by the electrode on the support member. In one embodiment, the first electrode should be as thin as possible to minimize the stress on the support member. The electrodes are isolated or separated from the contacts. The separation between the contact and electrodes depends on design requirements such as the insulation voltage between the feed and load circuits, and the maximum continuous driving voltage.

The dielectric layer 145, in one embodiment, is provided over the second electrode to provide isolation between the electrodes and other components as needed. Providing the dielectric layer over the first electrode or on both electrodes is also useful. The thickness of the dielectric layer depends on the insulation characteristics of the material and design requirements such as, for example, the insulation voltage between the feed and load circuits and maximum continuous driving voltage.

The electrodes and contacts are provided with respective connections or readouts 178 to contact pads 179. The exact configuration and location of the pads and leadouts are not important. The contact pads to the electrodes are coupled to voltage sources of opposite polarity, creating the drive circuit. The contact pads to the contacts are coupled to portions of the load circuit. When the contacts are not engaged, the load circuit is opened. Applying the oppositely charged voltages to the electrodes generates an electrostatic force, causing the support member to move upward. This engages the first and second contacts, closing the load circuit.

Illustratively, the first and second contacts are coupled to a respective portion of the load circuit. The leadout coupling the first contact to pad is provided over the first electrode. To isolate the electrode from the lead out, the first electrode is divided into two portions 141a and 141b. As such, leadouts are provided to couple the electrodes to a common pad. Alternatively, a dielectric layer can be provided under the lead out to provide electrical isolation between the electrode and the lead out.

In another embodiment, the first contact is not coupled to a portion of the load circuit. Instead, first and second counter contacts are provided, coupling to respective portions of the load circuit. The respective portions of the load circuit are electrically coupled when the support member is moved upward to make contact with first and second counter contacts. Such a design does not require a leadout and pad for the first contact, eliminating the need to divide the first electrode into two portions or to provide a dielectric layer between the leadout and electrode forming a bridge contact. Additional contacts or alternative contact configurations are also useful. For example, multiple sets of contacts can also be provided for driving a plurality of load circuits.

A sufficiently high force between the contacts is desired in order to have low contact resistance. The low contact resistance should be maintained over the lifetime of the relay, in view of contact wear. In one embodiment, the relay comprises an over-travel to produce high contact force between the contacts. The over-travel is the distance that one contact travels beyond the surface of the other contact in the absence of the other contact when the support member is moved upward to engage the contacts. Ideally, the over-travel adequately maintains the high contact force to produce a low stable contact resistance over the lifetime of the relay. The amount of over-travel provided depends on, for example, the wear on the contact and contact characteristics. The over-travel, for example, is about 5 µm. Other over-travel distances are also useful.

In one embodiment, the over-travel is incorporated in the support member. The over-travel results from an s-shaped support member (as shown by the dotted lines). The s-shape is achieved by inducing the main portion of the support member to deflect or bend about an axis in a first direction and inducing the end 165 to bend in the opposite direction. To create the s-shape, the main portion of the support member is induced to deflect downward away from the surface 109 while the end 165 is induced to bend upward toward the surface 109.

In one embodiment, over-travel is provided by inducing the main portion of the support member to deflect downward away from surface 109 while inducing the first contact region to deflect in the opposite direction of the main portion. In a preferred embodiment, the first contact region is isolated from remaining end portions 165a and 165b of the support member. Isolating the first contact region forms a cantilever within the support member. Such a design is advantageous as it increases the contact force applied between the contacts.

In one embodiment, a first stress layer 180 is provided on the surface 168 of the support member. The first stress layer induces a compressive stress on the support member, causing it to bend or arc downward away from the first electrode. Preferably, the first stress layer induces an intrinsic compressive stress of the support member. The second stress layer 181 is provided in the first contact region at about the second end of the support member, inducing a tensile stress to cause the first contact region to arc upward toward the surface 109. Preferably, the second stress layer induces an intrinsic tensile stress on the first contact region of the support member. This combination of the tensile and compressive stresses creates the s-shaped support member. The amount of bending depends on the material and its thickness. The material and thickness of the stress-inducing layers are selected to create the shape that produces the desired amount of over-travel.

In an alternative embodiment, the first stress-inducing layer is provided on the surface 168 of the support member except in the first contact region. The first layer induces a compressive stress on the support member, causing it to bend or arc downward away from the first electrode. The second layer is provided in the first contact region at about the second end of the support member, inducing a tensile stress to cause the first contact region to arc upward toward the surface 109.

The stress-inducing layers preferably comprise relatively high temperature formed materials such as those used in semiconductor processing. Such materials include, for example, silicon oxide, silicon nitride, poly, and epitaxially grown silicon. The materials can be doped or undoped.

The high temperature formed materials comprise stable mechanical properties (e.g., intrinsic stress, low fatigue and creep) and are unaffected by other lower temperature processes used in forming the relay. The stability and repeatability of high temperature formed materials provide an excellent stress-inducing layer, enabling the support member to maintain its shape over time and various a operating temperatures. This improves the reliability of the relay. Furthermore, the use of such materials reduce production cost.

Ad In one embodiment, the support member comprises silicon. The first stress-inducing layer comprises silicon oxide to induce compressive stress on the support member. Other materials that induce compressive stress on the support member, such as doped or undoped poly, are also useful. To induce tensile stress on the support member, the second stress-inducing layer comprises silicon nitride ($Si_3N_4$). Other materials that induce tensile stress on the support member are also useful.

Alternatively, metals or other materials formed by lower temperature processes to either induce compressive or tensile stress on the support member can also be used as stress-inducing layers.

As described, non-symmetrical material combinations having different stresses at about the bending axis are used to induce bending of a composite structure. The stress induced includes different components, such as intrinsic stress and stress due to thermal expansion. The different stress components can be affected by the thickness of the stress-inducing layer. Increasing or decreasing the thickness increases or decreases the magnitude of the intrinsic stress component on the support member. The thermal component of stress, which depends on a material's thermal coefficient of expansion (TCE), is also affected by temperature. The stress due to thermal expansion changes as the stress-inducing layer expands or contracts due to temperature variations.

In some applications, particular with devices that operate over a wide operating temperature range, it may be desirable to have a support member that maintains a stable shape over the contemplated operating temperature range. A stable support member can be maintained over a broad temperature range by effectively reducing or minimizing the thermal component of stress. Different techniques can be employed to reduce the stress variations from TCE.

In one embodiment of the invention, variations of stress due to TCE is reduced or minimized by employing stress-inducing layers comprising TCEs that are similar to that of the support member. Closely matching the TCEs of the different materials enables the support member to maintain a stable shape over the relay's contemplated operating temperature range.

Alternatively, variations in the stress induced by the stress layer due to thermal expansion can be avoided by using thinstress-inducing layers. Reducing the thickness of the stress layers decreases their thermal stress component. Using a thin stress layer may require the material to having a higher intrinsic stress component to produce the desired bending on the support member.

In yet another embodiment, a compensation layer is used to reduce or minimize the effects of a mismatch between the TCEs of the different layers. In one embodiment, the compensation layer is provided in contact with the stress-inducing layer. In one embodiment, the compensation layer is provided between the support member and stress-inducing layer. The compensation layer comprises a TCE that is similar but opposite (compressive instead or tensile or vice-versa) to that of the stress layer. Providing a compensation layer having the opposite TCE as the TCE of the stress-inducing layer cancels out the effects of the TCE mismatch.

In the case where the support member is not a part of the lower portion of the body, the compensation layer can be provided on the opposite surface on which the stress-inducing layer is located. In one embodiment, the compensation layer is provided on the lower surface of the support member while the stress-inducing layer is on the upper surface of the support member. The compensation layer comprises a TCE that is similar to that of the stress-inducing layer. Providing a compensation layer having a TCE that closely matches the TCE of the stress-inducing layer on the opposite surface of the support member cancels out effects of the TCE mismatch between the stress-inducing layer and support member.

The intrinsic stress in the compensation layer should be much lower than the intrinsic stress in the stress layer in order to reduce or minimize compensation layer's influence on the support member.

To ensure that the over-travel of the support member is not hindered, an over-travel region 170 can be provided on the surface 109. The over-travel region is created by recessing a surface 171 from surface 109. The over-travel region enables the upward bend of the support member not to be inhibited by the surface 109. The dimensions of the over-travel region should be sufficient to accommodate the over-travel of the support member. The surface area of the over-travel region should be larger than the surface area of the over-travel portion of the support member. The depth or height of the over-travel region is, for example, equal to the sum of the heights of the first and second contacts.

As shown from the plan view of FIG. 1b, the support member comprises a cantilever which is somewhat rectangular in shape. Other shapes, such as circular or elliptical shapes, are also useful. The size or surface area of the support member can be designed to take into account the size requirements of the electrodes in order to generate the force needed to move the support member. The surface area of the support member can be, for example, 1500 µm by 1200 µm.

Figure 2A:
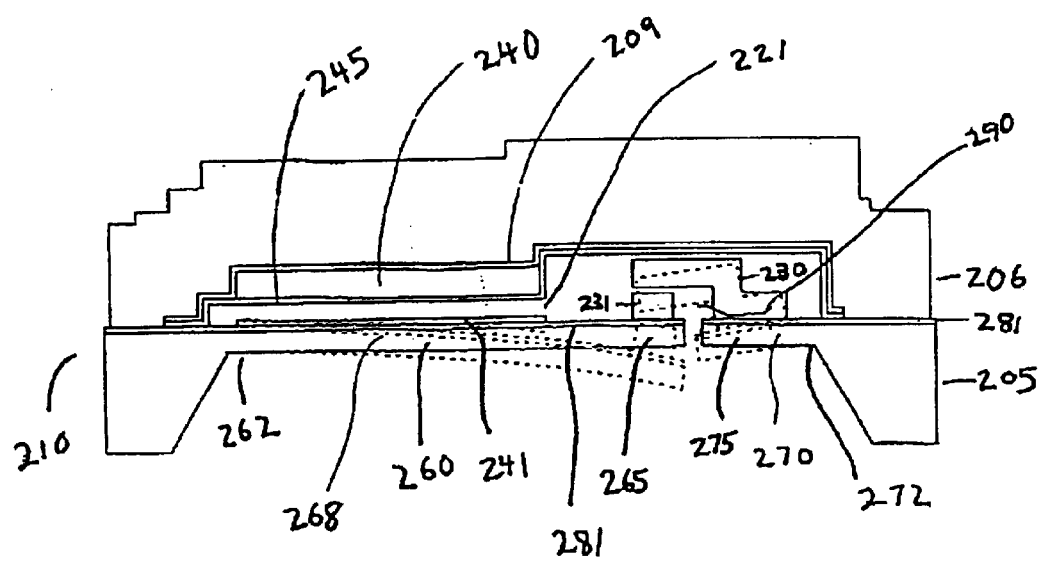
FIGS. 2a–2b are cross-sectional and plan views of a relay in accordance with another embodiment of the invention.
Figure 2B:
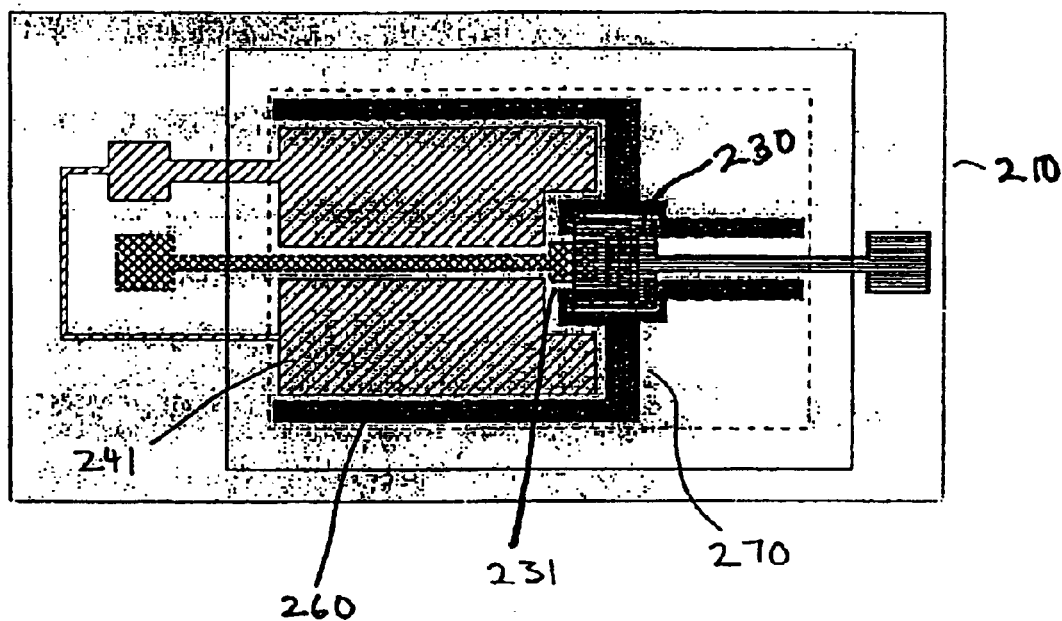

FIGS. 2a–b are cross-sectional and plan views of an alternative embodiment of the invention. As shown, the relay incorporates a dual support member design comprising first and second support members 260 and 270. The use of dual support members advantageously avoids the need of a second stress layer (tensile stress inducing layer) to produce the over-travel. The relay comprises a body 210. The first support member 260 is supported by the body at a first end 262, forming a cantilever. Likewise, the second support member comprises a cantilever having a first end 272 supported by the body. The support members are effectively in about a same plane. A gap separates the support members and a surface 209 of the body, forming a cavity 221.

In one embodiment, the body comprises lower and upper portions 205 and 206. The lower portion comprises silicon. Other crystalline materials such as gallium arsenide are also useful. Materials such as quartz, ceramics, glass, silicate glass such as borosilicate glass, Pyrex®, or materials that can provide support for the relay components a can also be used. The upper portion 105, in one embodiment, comprises nickel. Other materials, including gold, plastic, epoxy, and materials that can adequately support the relay components as needed, can be used.

Providing a support member that is not part of the lower portion of the body is also useful. With such a design, materials which are different from those comprising the lower portion of the body can be used for the support member. Materials that exhibit good spring characteristics (e.g., low fatigue and creep) are useful for the support member. A support member comprising poly, for example, can be useful. The poly can be deposited either as poly or as amorphous silicon and recrystallized to form poly. The use of epitaxially grown single crystalline material to form the support member is also useful. Nickel, nickel alloy such as nickel-iron, metals or other alloys that have the desired characteristics can also be used to form the support member.

A first contact 231 is located at about a second end 265 of the first support member, and a second contact 230 is located at about a second end 275 of the second support member. The contacts are positioned such that when the first support member moves upward toward the surface 209, they come into contact with each other.

In accordance with one embodiment of the invention, the second contact is the counter contact, and the first contact is moved upward to contact the second contact. The length of the second support member is relatively short to provide sufficient stiffness in order to produce the desired counter-force on the first contact when the contacts are engaged.

The first contact extends beyond the first support member to ensure that contact is made with the second contact when the second member is moved upward toward surface 209. In one embodiment, the portion of the contact that extends beyond the first support member is in a different plane with respect to the portion of the contact on the support member. In one embodiment, the portion of the contact that extends beyond the support member is in a plane elevated above the plane of the portion of the contact on the support member. This provides for separation of the contacts when they are not engaged.

A first electrode 241 is located on surface 268 of the first support member, and a second electrode 240 is located on surface 209. A dielectric layer 245 is provided over either the first or second electrode. Providing a dielectric layer over both electrodes is also useful. In one embodiment, the dielectric layer is provided over the second electrode. Upon the application of opposite charges to the first and second electrodes, the first support member moves upward toward the second electrode to create electrical coupling between the contacts.

Over-travel can be incorporated into the relay design. In one embodiment, over-travel is provided by arcing the first and second members downward away from surface 209 (as depicted by the dotted lines). The downward bend is incorporated by inducing compressive stress on the support members. As previously described, compressive stress is induced by the use of a compressive stress-inducing layer 281.

Providing an s-shaped first support member to produce over-travel is also useful. The s-shaped support member is created using a compressive and tensile stress-inducing layers as described in FIGS. 1a–b.

In one embodiment, an over-travel region 290 is provided. The over-travel region ensures that there is a sufficient gap between the counter contact 230 and end 265 to prevent obstructing over-travel of the support member 260.

FIGS. 3–8 show the process for forming a relay in accordance with one embodiment of the invention. The figures provide a cross-section of a 3-dimensional view of the process. The cross-section is taken along an axis at about half of the support member. The other half of the support member is typically, but not necessarily, symmetrical with the half as shown.

In accordance with one embodiment of the invention, electrochemical etch (ECE) techniques are used to form the support member. ECE techniques employ the use of oppositely doped regions and the application of a charge. In one embodiment, the ECE etches the p-typed doped regions and passivates on the n-doped regions. As such, the n-doped regions effectively serve as an etch stop. Using ECE to etch the n-doped regions instead of the p-doped regions could also be useful.

Figure 3:
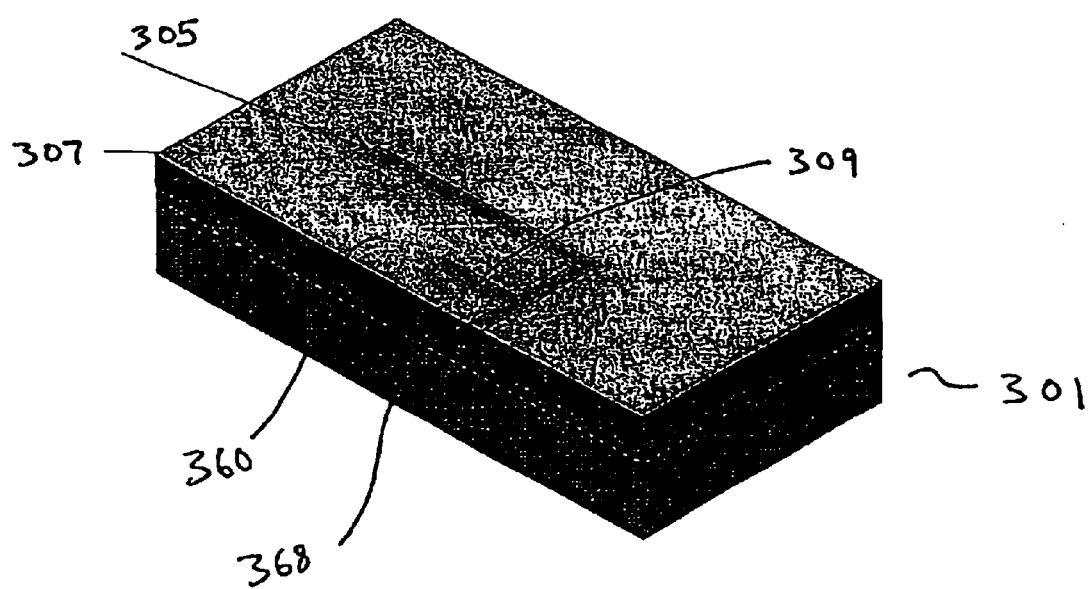
FIGS. 3–8 are three-dimensional views depicting a process of fabricating a relay in accordance with one embodiment of the invention.

Referring to FIGS. 3, a substrate 301 is provided. The substrate preferably comprises silicon such as a silicon wafer. Other crystalline substrates such as gallium arsenide are also useful. Substrates comprising materials such as quartz, ceramics, glass, silicate glass such as borosilicate glass (e.g. PYREX®), or materials that can provide support for the relay components can also be used.

In one embodiment, an ECE etchant that is selective to the crystal orientation of the substrate is employed. The use of an etchant that etches in certain crystal planes advantageously enables the use of wet etch chemistries to define the support member.

In one embodiment, KOH is employed as the ECE etchant to etch silicon. KOH preferably etches silicon in the 100 plane selective to the 111 plane (i.e., a much higher etch rate in the 100 plane with respect to other planes). To accommodate the etch characteristics of the etchant, the substrate is oriented in the 100 plane. Other crystal orientations may also be useful.

The substrate includes a first doped region 305 comprising dopants of a first type. In one embodiment, the first doped region comprises p-type dopants, such as boron (B). A second doped region 307 comprising dopants of a second type is formed on the surface of the substrate. In one embodiment, the second doped region comprises n-type dopants, such as arsenic (As) or phosphorus (P), in order to form an n-doped region. Using n-type dopants to form the first doped region and p-type dopants to form the second doped region is also useful.

The pattern or design of the second doped region defines the shape of the support member 360. As shown, the n-doped region is in the shape of a cantilever to serve as the support member. In one embodiment, the cantilever comprises edges that are perpendicular with respect to each other. Other cantilever shapes are also useful. For example, edges having angles other than 90° with respect to each other or curved edges are also useful. The depth of the second doped region defines the thickness of the support member. A subsequent ECE process selectively removes the first doped region 305 to form the support member.

The dimension of the support member determines its stiffness. The stiffness of the support member should enable the contacts to disengage or release when the voltage applied to the electrodes drops below the specified drop-out voltage and engage the contacts when the voltage applied to the electrodes exceeds the specified pull-in voltage. The dimension of the support member, for example, is about 1200 $\mu$m wide, 1500 $\mu$m long, and 10 $\mu$m thick. Other dimensions are also useful, depending on design specifications such as the pull-in and drop-out voltages.

In accordance with one embodiment of the invention, the first doped region comprises a heavily doped region, for example, a heavily p-doped (p+) region. In one embodiment, the p+ region comprises a dopant concentration that results in a resistivity of about 50 m$\Omega$*cm.

The use of a first doped region that is heavily doped provides an improvement over conventional ECE techniques, which use a lightly doped region. The lightly doped region results in a substrate having a resistivity of about 6–9 m$\Omega$*cm. At such resistivity, ECE can only form holes or slots of greater than 250 $\mu$m. Increasing the dopant concentration to decrease resistivity to less than 6 m$\Omega$*cm enables the formation of holes or slots less than 250 $\mu$m. Increasing the dopant concentration to result in a substrate having a resistivity of about 50 m$\Omega$*cm enables the formation of significantly smaller features, for example, less than 60 $\mu$m, preferably about 30 $\mu$m. Smaller features advantageously allow for smaller relay structures.

In one embodiment, a p-doped substrate having the desired dopant concentration is used to provide the p-doped region. Alternatively, p-type dopants are implanted and/or diffused into the substrate to form the p-doped region 305.

An n-doped region 307 is formed on the surface of the substrate. The n-doped region is formed by, for example, implanting dopants such as As or P, into selected regions of the substrate. The dopant concentration of the n-doped region should be sufficient to form a proper p-n junction with the p-doped region. Typically, the dopant concentration of the n-doped region is about $10^{18}$–$10^{20}$ atoms/cm$^3$. In one embodiment, a POCl$_3$ source is used to selectively deposit P dopants into the substrate to form the n-doped region 307. A diffusion mask comprising, for example, silicon oxide (SiO$_2$) is used to protect certain regions of the substrate from being diffused with dopants while allowing dopants to enter the unprotected regions of the substrate. Alternatively, the dopants can be selectively implanted into the substrate.

In one embodiment, a first contact region 368 in which a first contact is formed is defined at about an end 365 of the support member. The first contact region, in one embodiment, forms a cantilever within the support member. The cantilever is formed by including slots 309 in the implant mask used to define the support member. The slots form a cantilever which can be induced to bend upward and have sufficient stiffness to increase the contact force between contacts. The length of the slots, for example is about ⅓–½ of the length of the support member. In one embodiment, the length of the slots is about 500 $\mu$m.

Where the first doped region is formed by implanting and/or diffusing dopants into the substrate, the depth of the second doped region should be less than the depth of the first doped region to ensure correct formation of the support member by ECE.

After the second doped region is formed, the implant mask is removed by wet etching the oxide selective to silicon.

In one embodiment of the invention, an s-shaped support member is employed to provide over-travel. To form the s-shaped support member, first and second stress layers that induce tensile and compressive stresses are deposited on surface of the substrate. The stress layers preferably comprise high temperature formed materials. The high temperature materials are formed by semiconductor processing such as thermal oxidation in either dry or wet ambient and different types of chemical vapor deposition (CVD) processes such as low pressure CVD (LPCVD), high density CVD, or plasma enhanced CVD (PECVD). Such materials are desirable as they have very stable electrical and mechanical properties. For example, the intrinsic stress characteristics of the high temperature formed materials are very stable and are unaffected by the relatively lower temperature processes used to form other features of the relay. This results in a support member with a stable bend or shape. Lower temperature formed materials that are stable enough could also be used.

Figure 4:
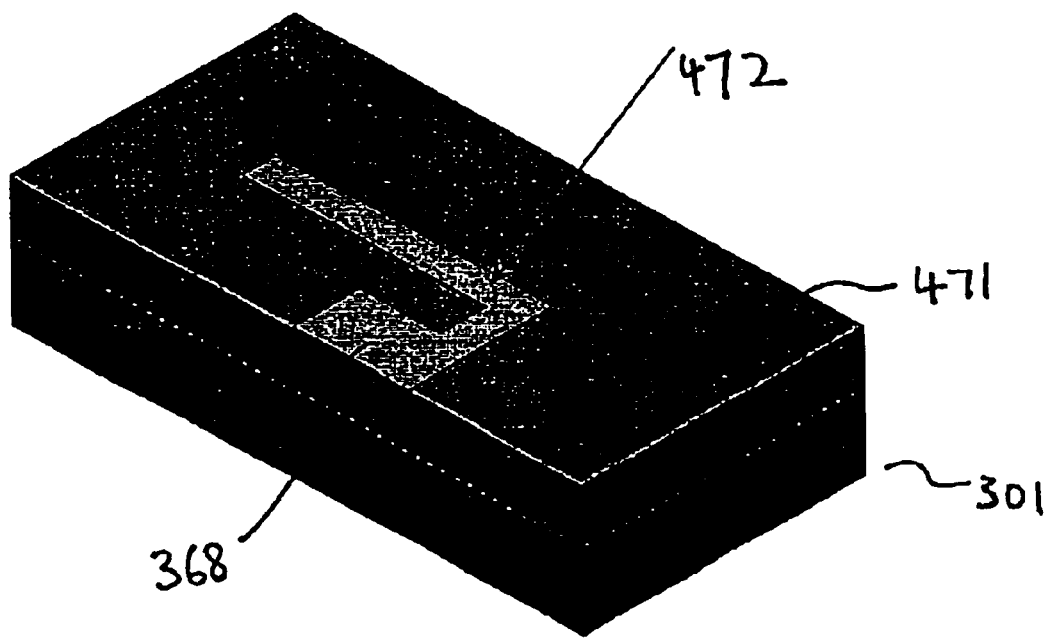

Referring to FIG. 4, a first stress layer is deposited on the surface of the substrate. The first stress layer induces compressive stress on the support member. The compressive stress causes the support member to arc downward.

In one embodiment, the first stress layer comprises silicon oxide (SiO$_2$). The thickness of the first stress layer induces the support member to bend as desired. Typically, the thickness of the SiO$_2$ is about 4000–5000 Å. The thickness of the stress layer can be varied, depending on design specifications such as over-travel and stiffness of the support member. In one embodiment, the $SiO_2$ is grown by thermal oxidation. The thermal oxidation can be performed in an oxygenated ambient. CVD techniques are also useful to form the first stress layer.

Alternatively, the first stress layer can comprise poly. The poly can be doped or undoped. The poly can be deposited as poly or as amorphous silicon which is subsequently recrystallized to form poly. Various CVD techniques can be used to deposit the poly. Relatively stable materials that are formed at lower temperatures may also be used. Other materials that are stable enough and induce tensile stress on the support member are also useful.

A second stress layer 472 is formed over the first stress layer. The second stress layer induces a compressive stress on the support member. In one embodiment, the second stress layer comprises $Si_3N_4$. The $Si_3N_4$ is deposited by, for example, LPCVD. Other techniques for forming the second stress layer are also useful. The thickness of the second stress layer causes the support member to bend upward as desired. Typically, the thickness of the second stress layer is about 1000–2000 Å. The thickness of the stress layer can vary, depending on design specifications such as over-travel and stiffness of the support member. A material that is formed at lower temperatures and which is relatively stable, can also be used to form the second stress layer. Other materials that are stable enough and induce tensile stress on the support member are also useful.

An etch selectively removes unwanted portions of the second stress-inducing layer, leaving a remaining portion in the first contact region. The remaining portion of the second stress-inducing layer causes the first contact region to arc in the opposite direction as the rest of the support member. In one embodiment, the etch also leaves portions of the second stress-inducing layer to completely cover the p-doped region and the first contact region. The second stress layer that covers the p-doped region acts as an etch stop for the subsequent ECE process to ensure that the other parts of the relay are protected from the ECE etchant.

Figure 5:
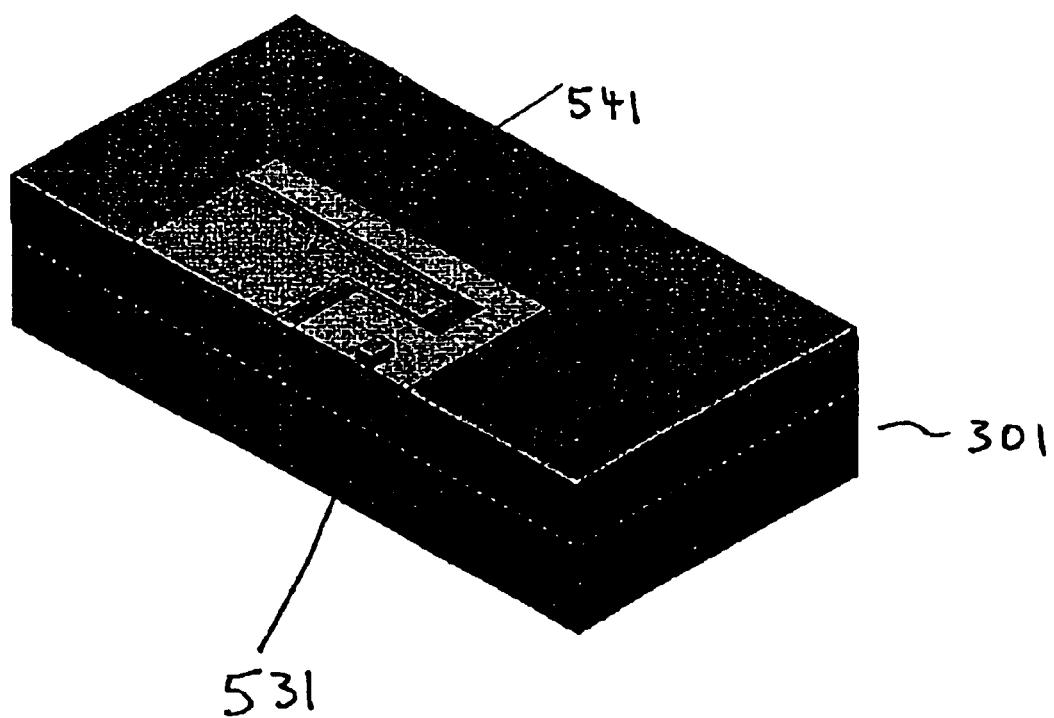

Referring to FIG. 5, a conductive layer is formed on the substrate surface by conventional techniques such as, for example, sputtering, physical vapor deposition, or electroplating. The conductive layer comprises, for example, gold or a gold alloy such as gold-nickel ($AuNi_5$), gold palladium, or gold-cobalt. Other conductive materials, such as silver, or silver alloys, are also useful.

To ensure adhesion of the conductive layer to the surface of the substrate, an adhesion layer can be deposited on the substrate surface prior to the formation of the conductive layer. In one embodiment, the adhesion a layer comprises titanium. The titanium layer can also serve as a barrier layer to reduce inter-diffusion. Other materials that promote adhesion of the conductive material and support member, such as chromium, are also useful to serve as the adhesion layer. The adhesion is deposited by, for example, sputtering or evaporation. Other deposition techniques are also useful.

After formation of the conductive and adhesion layers, they are patterned to form a first electrode 541 on the support member. In one embodiment, the conductive layer is patterned, leaving the conductive layer on the support member except the first contact region. To reduce the stress induced by the electrode on the support member, it should be thin. In one embodiment, the thickness of the electrode is about 75 nm.

A first contact 531 is formed in the first contact region. The contact comprises a conductive material such as gold. Alloys comprising gold such as gold-palladium, gold-nickel, and gold-cobalt or alloys comprising silver are also useful. Other materials that provide good contact characteristics can also be used. An adhesion layer such as titanium or chromium can be used to ensure adhesion of the contact material to the support member. The contact and adhesion layer are formed using conventional techniques such as, for example, sputtering, physical vapor deposition, electroplating, or other techniques.

In one embodiment, a pad and a leadout which connects the pad to the contact are also provided. The pad and leadout are, for example, formed from the same process as forming the contact. A readout region is provided during the formation of the first electrode to accommodate the leadout. The readout region, for example, separates the first electrode into first and second subsections.

In one embodiment, the first contact is formed using electroplating techniques. Such techniques use a seed layer on which the contact material is plated. The seed layer comprises a conductive material used to form the contact. Other types of materials that facilitate plating of the contact material can also be used. Various techniques, such as sputtering or evaporation, can be used to deposit the seed layer. An adhesion layer, for example titanium or chromium, may be provided to promote adhesion of the seed layer.

The adhesion and seed layers (adhesion/seed layer), in one embodiment, also serve as the first electrode. To reduce the stress effects on the support member by the adhesion and seed layers, they should be relatively thin. To minimize the stress effects on the support member, the adhesion/seed layer should be as thin as possible. In one embodiment, the adhesion layer is about 25 nm thick and the seed layer is about 50 nm thick, producing an adhesion/seed layer of about 75 nm thick.

In one embodiment, a mask is provided to selectively electroplate the conductive material in the first contact region to form the first contact. The mask, which may comprise resist, exposes the seed layer in the region where the first contact is to be formed. The conductive material is plated onto the exposed portions of the seed layer to form the first contact. The dimensions of the contact should be adequate to handle the specified load current. The height, for example, is about 2.5 $\mu$m.

The mask is removed after formation of the contact, exposing the seed/adhesion layer. An etch selectively removes portions of the seed/adhesion layer to form the first electrode 541. The etch, for example, comprises an anisotropic etch such as a reactive ion etch (RIE). A etch mask is used to protect the portions of the seed/adhesion layer that remain to serve as the first electrode.

In one embodiment, the etch mask for forming the first electrode need not protect the contact. This results in a small amount of the surface of the contact and leadout being removed as the seed/adhesion layer is patterned. However, since contact is much thicker than the seed/adhesion layer, a sufficient amount should remain to serve as the contact.

The first electrode is electrically insulated from the contact. As shown, the first electrode occupies the surface of the support member except for the first contact region. This design maximizes the surface area of the electrode. Also the masks used to form the electrode and contact can easily be modified to also include a pad and a leadout connecting the contact to the pad.

A dielectric layer can be provided underneath the lead out for the contact. The dielectric layer provides electrical insulation between the lead out and the electrode, eliminating the need to pattern the electrode into two subsections.

In an alternative embodiment, the conductive layer is electroplated onto the seed/adhesion layer. Also, the conductive layer can be deposited on an adhesion layer by, for example, sputtering or physical vapor deposition or other deposition process that does not require the use of a seed layer. The conductive layer is subsequently masked and etched to form the contact and, if applicable, the leadout and pad. Forming the contact by masking and etching requires the deposition of an addition conductive layer to serve as the electrode.

Figure 6:
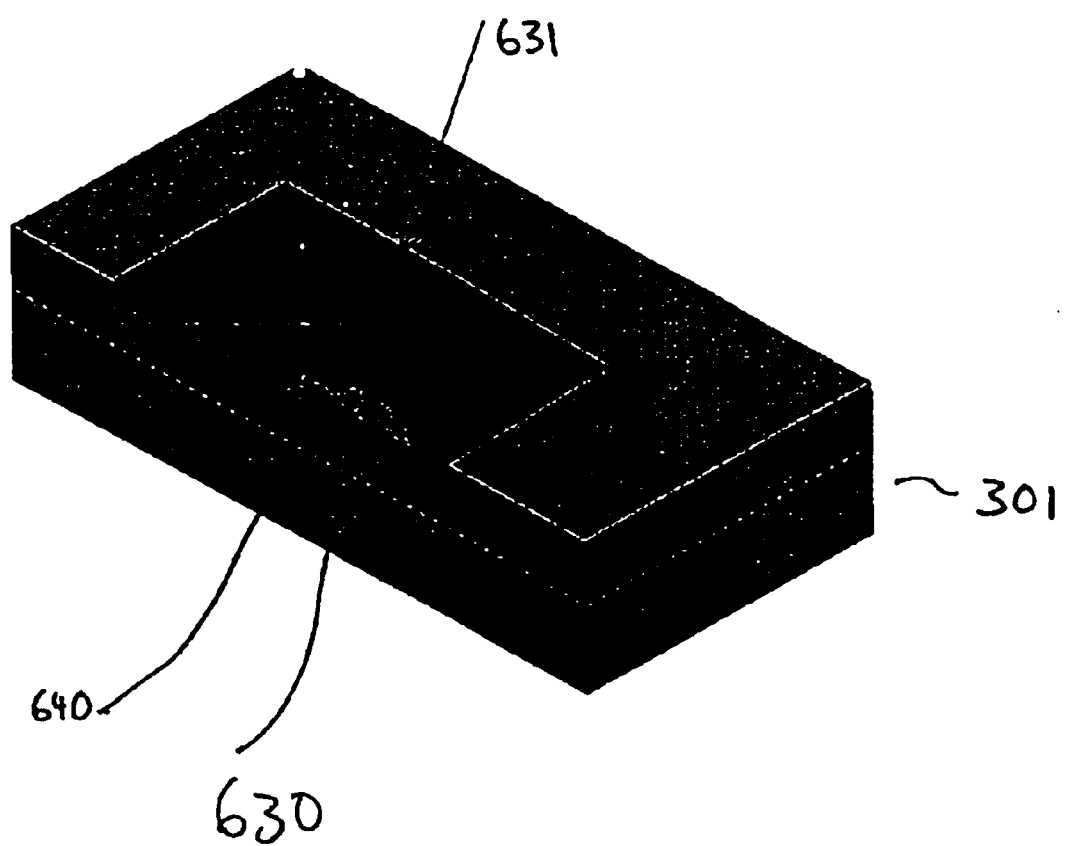

Referring to FIG. 6, an over-travel region is formed to ensure that the over-travel of the s-shaped support member is not hindered. To form the over-travel region, a first sacrificial layer 630 is deposited on the substrate. The thickness of the sacrificial layer determines the depth of the over-travel region. The thickness is sufficient to accommodate the over-travel of the support member. The thickness of the sacrificial layer is, for example about 3–3.5 $\mu$m for a contact height of 2.5 $\mu$m.

The sacrificial layer comprises a material that can be etched selectively to other relay materials. Preferably, the sacrificial layer comprises a material that can be etched quickly and easily without effectively removing other relay materials. In one embodiment, the first sacrificial layer comprises copper. Aluminum, titanium, zirconium, iron, polyimide or other materials that can be etched selective to other relay materials are also useful. The use of $SiO_2$ as a sacrificial layer can also be useful, particularly in the case of a nickel spring using $Si_3N_4$ and poly as stress layers. The copper is deposited by, for example, physical vapor deposition or sputtering. Other deposition techniques, depending on the sacrificial material, are also useful.

Conventional mask and etch processes are used to pattern the sacrificial layer to define the area of the over-travel region and to provide an opening 640 to the contact. The dimension of the over-travel region should be sufficient to ensure that the over-travel of the support member is not hindered. The opening 640 defines the portion of the second contact that comes into contact with the first contact when the contacts are engaged.

In cases where the conductive and the sacrificial materials interact to degrade the contact characteristics of the conductive layer by interdiffusion, a barrier layer can be provided between the two layers. Preferably, the barrier layer comprises a material that prevents interdiffusion between the conductive and sacrificial materials and can be removed selective to other relay materials. The barrier layer, for example, comprises titanium, chromium, tungsten, or palladium.

A second sacrificial layer 631 is deposited over the surface. The second sacrificial layer comprises a material that can be etched selectively to other relay materials. Preferably, the second sacrificial layer comprises a material that can be etched quickly and easily without removing other relay materials. In one embodiment, the second sacrificial layer comprises copper. Other materials that can be etched selective to other relay materials are also useful. The copper is deposited by, for example, physical vapor deposition or sputtering. Other deposition techniques, depending on the sacrificial material, are also useful. Although not necessary, the first and second sacrificial layers comprise the same material.

The second sacrificial layer defines the gap between the first and second electrodes. In one embodiment, the thickness of the second sacrificial layer is about 0.5 $\mu$m to produce a 0.5 $\mu$m separation between the electrodes. The second sacrificial layer is patterned by conventional mask and etch techniques to define the area of the cavity.

Figure 7:
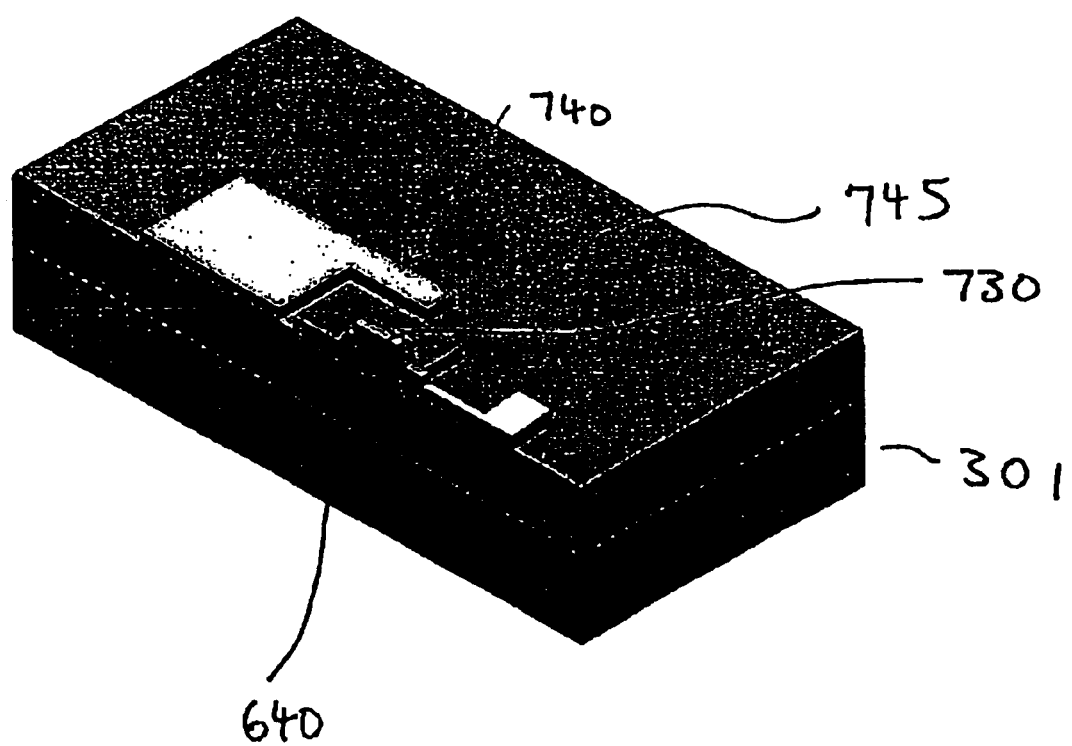

Referring to FIGS. 7, a dielectric layer 745 is deposited over the substrate to insulate the first electrode from the second electrode when the support member is moved upward. The thickness of the dielectric layer should be sufficient to provide electrical insulation as specified by design parameters. Typically the thickness of the dielectric layer is about 1 $\mu$m thick. Of course other thickness values can be used depending on design specifications and dielectric characteristics of the material.

The dielectric layer should provide good step coverage over the substrate topography created by the different features thereon. Silicon oxide or other dielectric layers such as silicon nitride can be used to form the dielectric layer.

In one embodiment, the dielectric layer comprises a silicon-rich silicon nitride ($Si_3N_4$) dielectric layer. The $Si_3N_4$ is deposited by PECVD. Other deposition techniques, such as LPCVD, are also useful. The dielectric layer is patterned, forming a contact opening to the first contact. Conventional masking and etching processes remove portions of the dielectric material to expose the contact opening 640.

The second electrode and second contact of the relay are formed. If necessary, a barrier layer can be provided on the surface of the second sacrificial layer prior to the formation of the contact and electrode to prevent interdiffusion between the contact and sacrificial materials. Preferably, the barrier layer comprises a material that can be selectively removed to other relay materials. The barrier layer, for example, comprises titanium, chromium, tungsten, or palladium. Other barrier materials which prevent interdiffusion between the contact a and sacrificial materials are also useful.

In one embodiment, the electrode and contact are formed by electroplating techniques as previously described. A seed layer to promote plating of the conductive material used to form the contact and electrode is formed by, for example, sputtering or other techniques on the substrate surface, covering the dielectric layer. In one embodiment, the seed layer comprises gold. Other materials that promote plating of the contact and electrode materials are also useful.

A conductive material is electroplated on the seed layer. The conductive material serves as the electrode and contact. In one embodiment, the conductive material comprises gold or a gold alloy such as gold-palladium, gold nickel ($AuNi_5$), or gold-cobalt. Other metals or alloys, such as silver or silver alloys, are also useful. Other materials that provide good contact characteristics can also be used. The thickness of the conductive material and seed layer, for example, is about 2.5 $\mu$m.

An adhesion layer is provided to promote adhesion of the contact and electrode to the upper portion of the relay body. The adhesion layer comprises, in one embodiment, titanium. An adhesion layer comprising chromium or a material that promotes adhesion of the conductive material to the upper portion of the relay is also useful. The adhesion layer can be deposited by sputtering, evaporation, plating or other techniques. The seed layer, conductive layer, and adhesion layers are patterned using conventional mask and etch processes to form the second electrode 740 and second contact 730. The mask and etch processes also form readouts and pads.

In an alternative embodiment, the conductive layer is deposited by sputtering, physical vapor deposition, or other deposition processes which do not require the use of a seed layer.

In yet another alternative embodiment, a mask layer is used to selectively plate the conductive material on the seed layer to form the second electrode and second contact. The mask is removed after the electrode and contact are formed. An adhesion layer is deposited and patterned to form the third adhesion layer over the second contact and second electrode.

Figure 8:
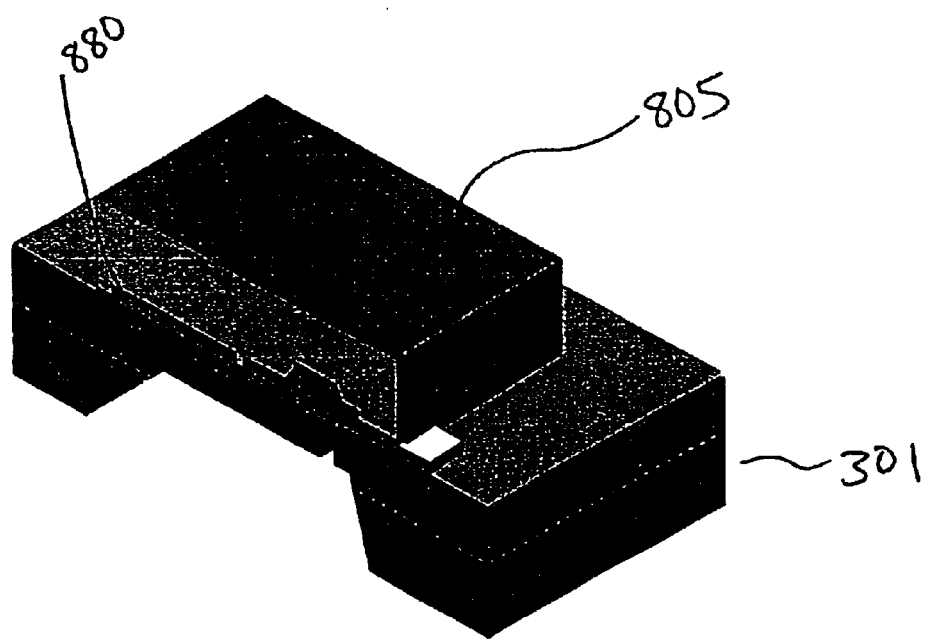

Referring to FIG. 8, a cap 805 is formed. The cap forms the upper portion of the relay, supporting the second electrode and second contact. The cap comprises a material sufficent to support the contact and electrode. In one embodiment, the cap comprises nickel or a nickel alloy such as NiFe. Materials such as gold, plastic, epoxy, or others materials that can adequately support the relay components as needed can be used.

If a conductive material is used to form the cap, a dielectric layer 880 is formed over the surface of the substrate prior the formation of the cap. The dielectric layer serves to insulate the cap from the contacts and electrodes to prevent shorting of the relay components. Various dielectrics can be used to form the dielectric layer. In one embodiment, the dielectric comprises $SiO_2$ formed by PECVD. Other techniques to form the dielectric layer are also useful. The thickness of dielectric layer is sufficient to satisfy design specifications. The dielectric layer is, for example, about 1 μm thick. Of course, the thickness can be varied depending on the design specification and the dielectric material used.

The dielectric layer is patterned using conventional techniques to cover the region of the substrate on which the cap is formed. The pads to the contacts and electrodes are exposed to allow access thereto.

In one embodiment, the nickel cap is formed by electroplating. An adhesion layer is formed over the substrate to promote adhesion between the cap materials and the substrate. The adhesion layer comprises, for example, titanium. Other materials such as chromium or materials that promote adhesion are also useful. The adhesion layer is about 25 nm. A seed layer is formed over the substrate to facilitate plating of the cap material. The seed layer comprises, for example, nickel of about 50 μm thick. The nickel cap layer is then electroplated onto the seed layer. The thickness of the cap is, for example, about 5–10 μm. The cap layer along with the adhesion and seed layers are patterned to form the cap 805. The pads to the contacts and electrodes are exposed to allow access thereto.

Alternatively, a mask layer is formed to selectively plate the cap layer in the cap region. The mask is removed, exposing the seed and adhesion layer. The exposed seed and adhesion layers are removed.

The backside of the substrate is masked, exposing the region of the substrate to be removed to form the cantilever support member. The substrate is etched using ECE techniques. The etch removes the p-doped regions of the substrate, including the area surrounded by n-doped regions. The ECE stops or passivates on the n-doped regions and the nitride. A etch then removes the nitride layer, exposing the sacrificial layers. The etch, which for example comprises a dry etch, employs chemistry that etches nitride selective to silicon. A wet etch is then employed to etch the sacrificial layers and barrier layers, separating the support member from the upper portion of the relay body.

In another embodiment, the first contact is not provided with a lead out. Instead, the first contact serves as a bridging contact to electrically couple first and second contacts located in the second contact region in the upper portion of the relay body.

Figure 9:
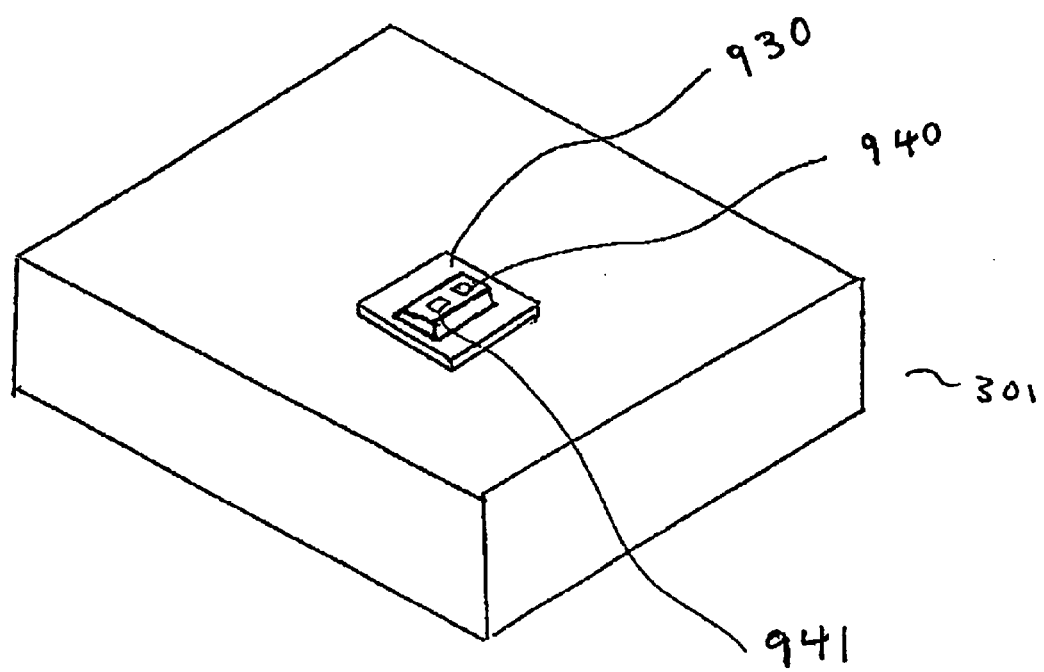
FIGS. 9–10 are three-dimensional views depicting an alternative process of fabricating a relay.

Referring to FIG. 9, a substrate 301 having been processed to include a patterned first sacrificial layer 930 is shown. First and second contact openings 940 and 941 are formed, exposing the surface of the first contact beneath. The process continues, providing a second sacrificial layer and dielectric layer as previously described.

Figure 10:
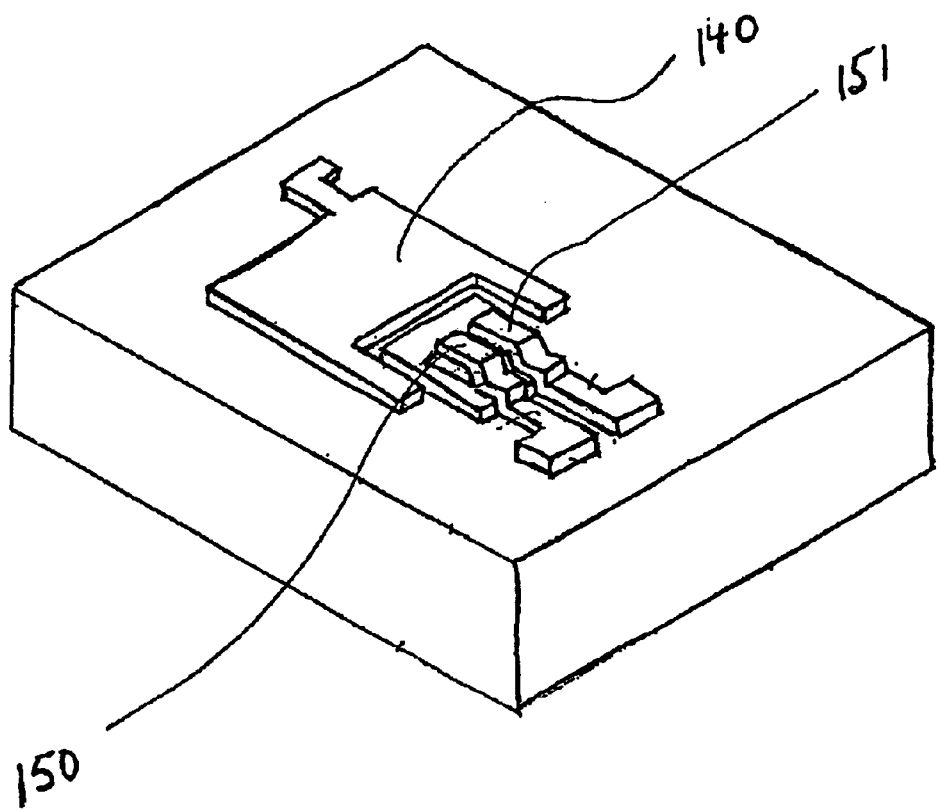

Referring to FIG. 10, electrode 140 and second and third contacts 150 and 151 are formed. Contact pads and readouts can also be provided for the electrode and the contacts. The contacts and electrode are formed by electroplating techniques. Other techniques, such as depositing a conducting layer and patterning it to form the contacts and electrodes, are also useful. The process continues as previously described to complete the relay.

Figure 11:
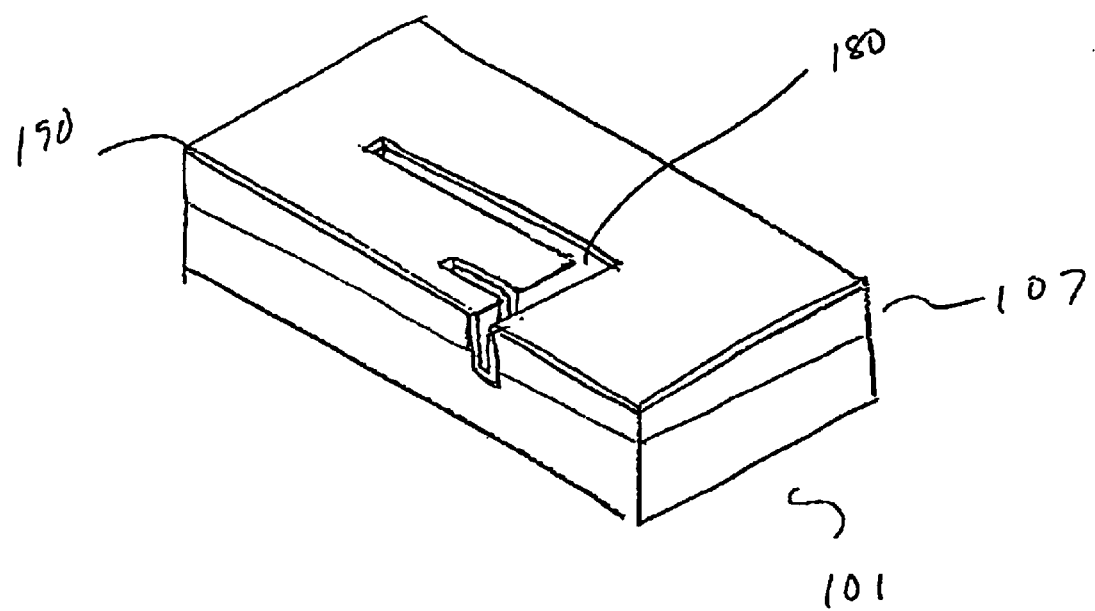
FIGS. 11–12 are three-dimensional views depicting another process of fabricating a relay.

In an alternative embodiment of the invention, the support member is defined by removing portions of the substrate. Referring to FIG. 11, a substrate 101 is provided. The substrate is, for example, a silicon wafer. Other types of substrates are also useful. The substrate comprises a first doped region, such as a p-doped region. The first doped region can be either part of the substrate or formed. A second doped region 107, such as an n-doped region, is provided on the surface of the substrate. The depth of the second doped region defines the thickness of the support member.

As the support member is defined by etching into the surface of the substrate, it is not necessary to provide a heavily doped region. An etch mask is formed on the surface of the substrate and patterned to expose portions of the substrate. The pattern of the mask defines the shape of the support member.

The exposed portions of the substrate are removed by an anisotropic etch such as RIE, forming a trench 180 on the surface of the substrate. The depth of the trench is deeper than the n-doped region to ensure correct formation of the support member by the subsequent ECE etch as described in FIG. 8.

A barrier layer 190 for the subsequent ECE etch as described in FIG. 8 is formed on the substrate, covering the surface and lining the trench. In one embodiment, the ECE etch barrier comprises $Si_3N_4$. Other materials that is not etched by the ECE etch chemistry can also be used.

Figure 12:
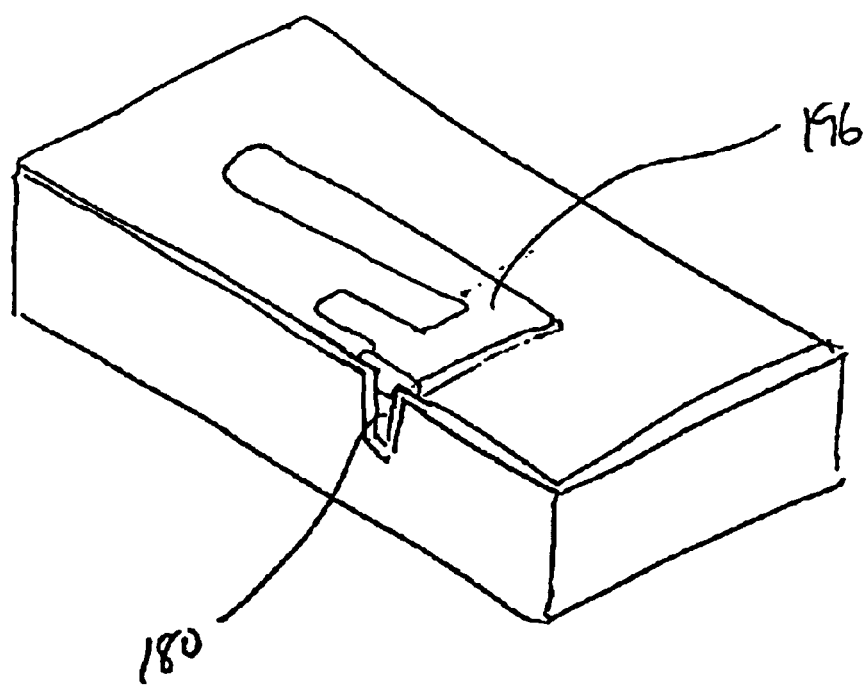

Referring to FIG. 12, a plug 196 is provided over the trench 180 to enable subsequent processing. The plug comprises, in one embodiment, aluminum. The plug is formed by sputtering aluminum on the substrate. Other deposition techniques are also useful.

Alternatively, the plug material comprises silicate glass. In one embodiment, the plug material comprises doped silicate glass. The doped silicate is, for example borophosphosilicate glass (BPSG). Materials that can fill the trenches are also useful. Other doped silicate glass, such as phosphosilicate glass (PSG) and borosilicate glass (BSG), or undoped'silicate glass can also be used. If the plug material used is unaffected by the etch ECE chemistry, a separate ECE barrier layer is not necessary since the plug can serve as the ECE barrier.

The process for forming-the relay continues as described in FIG. 4.

In another embodiment, a dual support member is provided in the relay as described in FIG. 2 Fabricating the dual support member relay is similar to the process already described except a second support member is defined during the process of defining the support member.

To form the over-travel region, an additional sacrificial layer is used. In one embodiment, the dual support member relay employs the use of three sacrificial layers. For example, the first sacrificial layer defines the gap between the first and second contacts, the second sacrificial layer defines the over-travel region, and the third sacrificial layer defines the gap between the first and second electrodes.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

What is claimed is:

1. A microstructure relay comprising:
 a body including upper and lower portions, wherein the lower portion is formed from a substrate and the upper portion is formed on the substrate to avoid bonding of the lower portion to the upper portion;
 a support member having a first end fixed to the body to form a cantilever, wherein an upper surface of the support member and a lower surface of the upper portion of the body forms a cavity; and
 a first contact region located on the upper surface at a second end of the support member, the first Contact region comprising a first contact the pivoting the support member toward the lower surface causes the first contact to be electrically coupled to a counter contact,
 wherein the support member comprises an s-shape to provide for over-travel when the support member is pivoted toward the lower surface.

2. The microstructure relay of claim 1 wherein the s-shape support member comprises first and second stress layers, the first stress layer inducing a compressive stress on the support member to cause it to bend away from the low surface, and the second stress layer inducing a tensile stress on the first contact region to cause the first contact region to bend toward the lower surface.

3. The microstructure relay of claim 2 wherein the bend of the first contact region toward the lower surface defines an over-travel.

4. The microstructure relay of claim 3 further comprising an over-travel region in the lower surface, the over-travel region accommodating the bend of the fist contact region to prevent the over-travel from being obstructed.

5. The microstructure relay of claim 4 wherein the support member comprises silicon.

6. The microstructure relay of claim 5 wherein the first stress layer comprises silicon oxide.

7. The microstructure relay of claim 6 wherein the second stress layer comprises silicon nitride.

8. The microstructure relay of claim 7 wherein the lower portion of the body comprises silicon.

9. The microstructure relay of claim 8 wherein the upper portion comprises nickel.

10. The microstructure relay of claim 9 further comprising a dielectric layer insulating the upper portion of the body from the second contact and second electrode.

11. The microstructure relay of claim 4 wherein the support member comprises nickel.

12. The microstructure relay of claim 11 wherein the first stress-inducing layer comprises silicon oxide and the second stress-inducing layer comprises polysilicon.

13. The microstructure relay of claim 12 wherein the polysilicon comprises doped polysilicon.

14. The microstructure relay of claim 13 further comprises a compensation layer on a surface of the support member opposite the upper surface, the compensation layer having a thermal coefficient of expansion (TCE) similar in magnitude to a TCE of the first stress-inducing layer.

15. The microstructure relay of claim 14 wherein the compensation layer and the first stress layer have intrinsic stresses and the intrinsic stress of the compensation layer is lower than the intrinsic stress of the first stress layer to reduce the influence of the compensation layer on the support member.

16. A microstructure relay comprising:
 a body including upper and lower portions, wherein the lower portion is formed from a substrate and the upper portion is formed on the substrate to avoid bonding of the lower portion to the upper portion;
 a support member having a first end fixed to the body to form a cantilever, wherein an upper surface of the support member and a lower surface of the upper portion of the body forms a cavity;
 a first contact region located on the upper surface at a second end of the support member, the first contact region comprising a first contact, wherein pivoting the support member toward the lower surface causes the first contact to be electrically coupled to a counter contact; and
 a stress-inducing layer on the upper surfaces of the fast and second support members, the stress layer inducing a compressive stress on support member to cause it to bend away from the lower surface upper portion of the body.

17. The microstructure relay of claim 16 wherein the support member comprises silicon.

18. The microstructure relay of claim 17 wherein the stress-inducing layer comprises silicon oxide.

19. The microstructure relay of claim 18 wherein the second support member is shorter than the first support member.

20. The microstructure relay of claim 19 wherein an over-travel is defined by the second support member.

21. The microstructure relay of claim 20 further comprises an over-travel region on the second support member to ensure the over-travel is not obstructed as the first support member is pivoted toward the lower surface.

22. A micro-relay comprising:
 a body including upper and lower portions,
 a support member supported at a first end by the body to form a cantilever, where a major surface of the support member and a lower surface of the upper portion of the body forms a cavity; and
 a first contact region located on the major surface at a second end of the support member, the first contact region comprising a first contact,
 the support member comprising an s-shape, wherein a body of the support member bends in a direction away from the surface of the upper portion of the body and the first contact region beads in a direction toward the surface of the upper portion of the body,
 the s-shaped support member, when pivoted toward the lower surface, causes the first contact to be electrically coupled to a counter contact.

23. The microstructure relay of claim 22 wherein the support member is pivoted toward the lower surface by electrostatic force, the electrostatic force generated by applying a voltage potential to a first electrode located on the upper surface and a second electrode located on the lower surface.

24. The microstructure relay of claim 23 further comprises a second contact region on the lower surface, the second contact region comprising the second contact.

25. The microstructure relay of claim 24 wherein the s-shape support member comprises first and second stress layers, the first stress layer inducing a compressive stress on the support member to cause it to bend away from the lower surface, and the second stress layer inducing a tensile stress on the first contact region to cause the fist contact region to bend toward the lower surface.

26. The microstructure relay of claim 25 wherein the bend of the first contact region toward the lower surface defines an over-travel.

27. The microstructure relay of claim 26 further comprising an over-travel region in the lower surface, the over-travel region accommodating the bend of the fast contact region to prevent the over-travel from being obstructed.

28. The microstructure relay of claim 27 wherein the support member comprises silicon.

29. The microstructure relay of claim 28 wherein the first stress layer comprises silicon oxide.

30. The microstructure relay of claim 29 wherein the second stress layer comprises silicon nitride.

31. The microstructure relay of claim 30 wherein the lower portion of the body comprises silicon.

32. The microstructure relay of claim 31 wherein the upper portion comprises nickel.

33. The microstructure relay of claim 32 further comprising a dielectric layer insulating the upper portion of the body from the second contact and second electrode.

34. The microstructure relay of claim 27 wherein the support member comprises nickel.

35. The microstructure relay of claim 34 wherein the first stress-inducing layer comprises silicon oxide and the second stress-inducing layer comprises polysilicon.

36. The microstructure relay of claim 35 wherein the polysilicon comprises doped polysilicon.

37. The microstructure relay of claim 36 further comprises a compensation layer on a surface of the support member opposite the upper surface, the compensation layer having a thermal coefficient of expansion (TCE) similar in magnitude to a TCE of the first stress-inducing layer.

38. The microstructure relay of claim 37 wherein the compensation layer and the first stress layer have intrinsic stresses and the intrinsic stress of the compensation layer is lower than the intrinsic stress of the first stress layer to reduce the influence of the compensation layer on the support member.

39. The microstructure relay of claim 23 further comprises a second support member, the second support member having a first end fixed to the body and the counter contact is supported at a second end on an upper surface of the second support member, wherein the support member is pivoted toward the lower surface by electrostatic force, the electrostatic force generated by applying a voltage potential to the first and second electrodes, the first electrode is located on the upper surface and the second electrode is located on the lower surface.

40. The microstructure relay of claim 39 further comprises a stress-inducing layer on the upper surfaces of the first and second support members, the stress layer inducing a compressive s on support member to cause it to bend away from the lower surface upper portion of the body.

41. The microstructure relay of claim 40 wherein the support member comprises silicon.

42. The microstructure relay of claim 41 wherein the stress-inducing layer comprises silicon oxide.

43. The microstructure relay of claim 42 wherein the second support member is shorter than the first support member.

44. The microstructure relay of claim 43 wherein an over-travel is defined by the second support member.

45. The microstructure relay of claim 44 further comprises an over-travel region on the second support member to ensure the over-travel is not obstructed as the first support member is pivoted toward the lower surface.

* * * * *